United States Patent
Gilman et al.

(10) Patent No.: US 8,342,383 B2
(45) Date of Patent: Jan. 1, 2013

(54) METHOD FOR FORMING SPUTTER TARGET ASSEMBLIES HAVING A CONTROLLED SOLDER THICKNESS

(75) Inventors: Paul S. Gilman, Suffern, NY (US); Binu Mathew, Spring Valley, NY (US); Brian J. O'Hara, Harriman, NY (US); Thomas J. Hunt, Peekskill, NY (US); Peter McDonald, Pearl River, NY (US); Holger J. Koenigsmann, Congers, NY (US)

(73) Assignee: Praxair Technology, Inc., Danbury, CT (US)

( * ) Notice: Subject to any disclaimer, the term of this patent is extended or adjusted under 35 U.S.C. 154(b) by 706 days.

(21) Appl. No.: 11/480,831

(22) Filed: Jul. 6, 2006

(65) Prior Publication Data
US 2008/0006528 A1    Jan. 10, 2008

(51) Int. Cl.
*B23K 20/08* (2006.01)
(52) U.S. Cl. .................. 228/107; 228/245; 228/249
(58) Field of Classification Search .................. 228/107, 228/212, 213, 245, 249, 251, 2.5
See application file for complete search history.

(56) References Cited

U.S. PATENT DOCUMENTS

| | | | |
|---|---|---|---|
| 4,476,151 A * | 10/1984 | Keller et al. | 204/298.12 |
| 5,230,462 A | 7/1993 | Vascak et al. | 228/222 |
| 5,282,946 A * | 2/1994 | Kinoshita et al. | 204/298.13 |
| 5,538,795 A | 7/1996 | Barbee, Jr. et al. | 428/420 |
| 5,693,203 A | 12/1997 | Ohhashi et al. | 204/298.12 |
| 5,857,611 A | 1/1999 | Gilman et al. | |
| 6,071,389 A | 6/2000 | Zhang | |
| 6,708,870 B2 | 3/2004 | Koenigsmann et al. | 228/210 |
| 6,736,942 B2 | 5/2004 | Weihs et al. | |
| 6,863,992 B2 | 3/2005 | Weihs et al. | 428/607 |
| 6,988,306 B2 | 1/2006 | Koenigsmann et al. | |
| 7,441,688 B2 | 10/2008 | Van Heerden et al. | |
| 2002/0182436 A1 | 12/2002 | Weihs et al. | |
| 2004/0222090 A1 | 11/2004 | Scott et al. | |
| 2005/0051607 A1 | 3/2005 | Wang et al. | |
| 2005/0115045 A1* | 6/2005 | Koenigsmann et al. | 29/446 |
| 2005/0142495 A1* | 6/2005 | Van Heerden et al. | 430/311 |
| 2008/0299410 A1 | 12/2008 | Duckham et al. | |

FOREIGN PATENT DOCUMENTS

WO    WO 96/23085    1/1996

* cited by examiner

*Primary Examiner* — Maria Veronica Ewald
*Assistant Examiner* — Megha Mehta
(74) *Attorney, Agent, or Firm* — Nilay S. Dalal

(57) ABSTRACT

The present invention relates to a method and apparatus of forming a sputter target assembly having a controlled solder thickness. In particular, the method includes the introduction of a bonding foil, between the backing plate and the sputter target, wherein the bonding foil is an ignitable heterogeneous stratified structure for the propagation of an exothermic reaction.

13 Claims, 3 Drawing Sheets

METHOD FOR FORMING SPUTTER TARGET ASSEMBLIES HAVING A CONTROLLED SOLDER THICKNESS

FIELD OF THE INVENTION

This invention relates to the field of sputter targets. In particular, this invention relates to methods of attaching backing plates to sputter targets with a bonding foil so as to form a sputter target assembly utilized in the physical vapor deposition of films.

BACKGROUND OF THE INVENTION

Cathodic sputtering is a widely utilized means for the deposition of thin layers of materials onto substrates. Generally, this process requires a gas ion bombardment of the target having a face formed of a desired material that is to be deposited as a thin film or layer on the substrate. Ion bombardment of the target not only causes atoms or molecules of the target material to be sputtered, but imparts considerable thermal energy to the target. This heat is dissipated by use of a cooling fluid typically circulated beneath or around a backing plate that is positioned in heat exchange relation with the target.

The target forms a part of a cathode assembly which together with an anode is placed in an evacuated chamber that contains an inert gas, preferably argon. A high voltage electrical field is applied across the cathode and anode. The inert gas is ionized by collision with the electrons ejected from the cathode. Positively charged gas ions are attracted to the cathode and, upon impingement with the target surface, dislodge the target material. The dislodged target materials traverse the evacuated enclosure and deposit as a thin film on the desired substrate that is normally located proximate the anode.

In conventional target cathode assemblies, the target is attached to a non-magnetic backing plate. The backing plate holds the sputter target in a sputtering chamber and also provides structural support to the sputter target. The backing plate is normally water-cooled to carry away the heat generated by the ion bombardment of the target. Magnets are typically arranged beneath the backing plate in well-known dispositions in order to form the above-noted magnetic field in the form of a loop or tunnel extending around the exposed face of the target.

In order to achieve good thermal and electrical contact between the target and the backing plate, these members are commonly attached to each other by use of soldering, brazing, diffusion bonding, clamping, epoxy cements, or with interlocking annular members. The technique selected is dependent on the characteristics of the joined materials and on the desired properties and characteristics of the target assembly.

The soldering technique is typically utilized to join a ferromagnetic sputter target, by way of example, pure nickel (Ni) and Ni-based alloys, such as NiFe and NiFeCo; pure iron (Fe) and Fe-based alloys, such as FeTa, FeCo and FeNi; pure cobalt (Co) and Co-based alloys, such as CoCr and CoCrPt. The target is typically bonded to the backing plate by means of a solder which may have a melting point of about 140 to 220° C., such as indium-tin, tin-lead, or tin-silver-copper. Heating of the target and backing plate to such temperatures to melt the solder is problematic in that it may affect the target microstructure. Further, due to the large difference in thermal expansion properties between the two parts, part warpage and differential part contraction may occur.

Vascak et al (U.S. Pat. No. 5,230,462) relates to solder bonding a sputter target to a backing plate for subsequent use in a sputtering operation. The solder is wetted onto the confronting sides of the backing plate and the target, submerging the backing plate and target in a solder bath and subsequently pressing the wetted parts into contact.

Koenigsmann et al (U.S. Pat. No. 6,708,870 B2) discloses a combination of solid-state bonding and securing a target insert to a backing plate with a filler metal surrounding the perimeter of a cooling or backing plate.

Ohhashi et al (U.S. Pat. No. 5,693,203) discloses the use of solid state bonding to avoid the high pressure and temperatures typically required for diffusion bonding. This patent describes pressing a metal foil between a backing plate and a sputter target to form a solid state bond.

The present invention provides several advantages over the related art. In particular, the present invention provides a solder bonding technique including the application of bonding foil between the target and the backing plate and igniting same to produce enough energy to melt the solder applied to the target and backing plate. Minimal heating of the assembly is observed and the process allows the solder layer thickness to be carefully controlled.

Another object of the present invention is to provide a target assembly with uniform target material thickness and symmetric magnetic leakage flux.

Other objects and aspects of the present invention will become apparent to one of ordinary skill in the art upon review of the specification, drawings and claims appended hereto.

SUMMARY OF THE INVENTION

According to one aspect of the invention, a method of forming a sputter target assembly is provided. The method includes the steps of: providing a backing plate having a top surface, and pre-wetting the top surface with a solder layer; providing a sputter target having a bottom surface, and pre-wetting the bottom surface with a solder layer; introducing a bonding foil, between the backing plate and the sputter target, wherein the boding foil is an ignitable heterogeneous stratified structure for the propagation of an exothermic reaction; pressing the backing plate and the sputter target together and igniting the bonding foil, therebetween to melt and bond the solder layer on the backing plate with the solder layer on the sputter target without affecting the microstructure or flatness of the sputter target in the formation of the sputter target assembly.

In accordance with another aspect of the invention, a sputter target, a backing plate and a bonding foil, disposed between the backing plate and the sputter target, is provided. The bonding foil is an ignitable heterogeneous stratified structure for the propagation of an exothermic reaction in order to bond the sputter target to the backing plate without affecting the microstructure or flatness of the sputter target in the formation of the sputter target assembly.

BRIEF DESCRIPTION OF THE DRAWINGS

The objects and advantages of the invention will become apparent for the following detailed description of the exemplary embodiments thereof in connection with the accompanying drawings wherein like numbers denote like features and in which:

FIG. 4A is a graphical representation of the solder layer thickness and range for a Ni 300 mm target assembly manufactured in accordance with the present invention as compared to the related art, whereas FIG. 5A depicts the non-symmetric magnetic leakage flux in a related art target assembly; whereas

DETAILED DESCRIPTION OF THE INVENTION

The present invention provides a planar single-piece ferromagnetic sputter target and assembly. The ferromagnetic sputter targets and assemblies are manufactured by a novel soldering process, wherein bonding foil (also known as reactive foil) is introduced between the sputter target and the backing plate. In accordance with the principles of the present invention, a ferromagnetic material is formed into a solid, unitary sputter target configuration, such as a plate having an even magnetic permeability throughout the material. Ferromagnetic materials contemplated by the invention include, by way of example, pure nickel (Ni) and Ni-based alloys, such as NiFe and NiFeCo; pure iron (Fe) and Fe-based alloys, such as FeTa, FeCo and FeNi; pure cobalt (Co) and Co-based alloys, such as CoCr and CoCrPt; and other binary, ternary and higher degree of elemental alloys comprising Ni, Fe, Co and other elements having an intrinsic magnetic permeability greater than 1.0.

Figure 1:
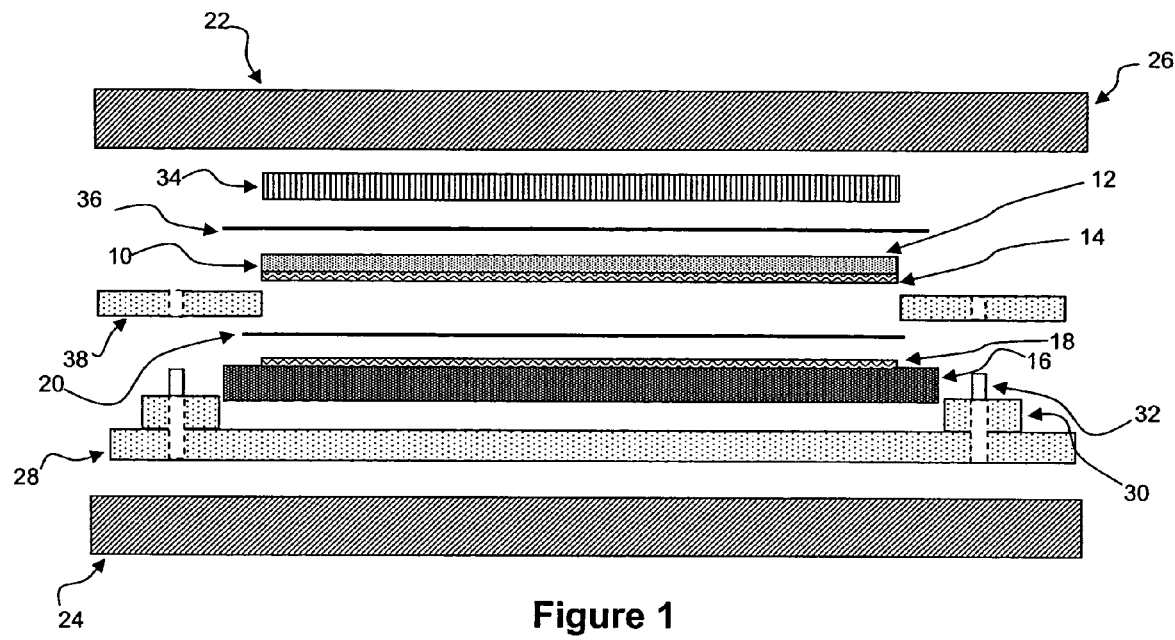
FIG. 1 is a schematic cross section of the press set-up and the target assembly components therein.

With reference to FIG. 1, sputter target 10 is a substantially circular disc-shaped, high-purity ferromagnetic sputter target. The ferromagnetic sputter target has a purity of at least about 99.99 weight percent. For purposes of this specification, all concentrations are in weight percent. Advantageously, sputter targets have a purity of at least 99.995 weight percent and more advantageously at least about 99.999 weight percent. While sputter target 10, as depicted, is disc-shaped, it will be understood by those skilled in the art that other target shapes, such as oval, square, or rectangular may be utilized.

Target 10 can be manufactured from a blank workpiece, which is forged and hot worked or cold worked or cryogenically formed. Hot working reduces the residual stresses in the workpiece, but typically results in a higher magnetic permeability than cold working or cryogenic forming. The sputtering surface 12 is typically maintained planar to dislodge the material therefrom continuously and to place a uniform layer onto the substrate. The bottom surface (or non-sputtering surface) of the target is pre-wetted with a solder layer 14 to facilitate the mating with backing plate 16.

The metals utilized for the backing plate may be any number of metals and include aluminum (Al), titanium (Ti), copper (Cu), and alloys thereof. Preferably, the backing plate is made of a copper alloy. Backing plate 16 includes a top surface which is utilized to mate with sputter target 10. Like the bottom surface of the target, the top surface of the backing plate is pre-wetted with a solder layer 18. These solder materials can be selected from among conventional indium-tin, tin-lead, tin-silver-copper, or other tin-based alloys.

A bonding or reactive foil 20 is introduced between sputter target 10 and backing plate 16 prior to pressing the components together. The bonding foil is an ignitable heterogeneous stratified structure. Some of the exemplary materials, which may be used in the manufacture of bonding foil 20 are selected from among silicides, aluminides, borides, carbides, thermite reacting compounds, alloys, metallic glasses and composites. These types of bonding foils are discussed in Barbee, Jr. et al and Weihs et al (U.S. Pat. Nos. 5,538,795 and 6,863,992, respectively) and which are hereby incorporated by reference in their entirety.

Platens 22 and 24 of press 26 are brought to bear a substantially uniform amount of pressure in uniting sputter target 10 and backing plate 16, with bond foil 20 therebetween. The bond foil is ignited via a DC source (not shown), so that an exothermic reaction is created. The heat generated during this reaction melts solder layers 14 and 18, but does not penetrate into sputter target 10 or backing plate 16. Preferably, the depth is about 0.005 inches or less, causing the applied solder layers to melt and bond together contemporaneously without causing warping or disturbance in the crystallographic or metallurgical structure of either sputter target 10 or backing plate 16. As a result the sputter target maintains its flatness as well as its metallurgical integrity.

Figure 2:
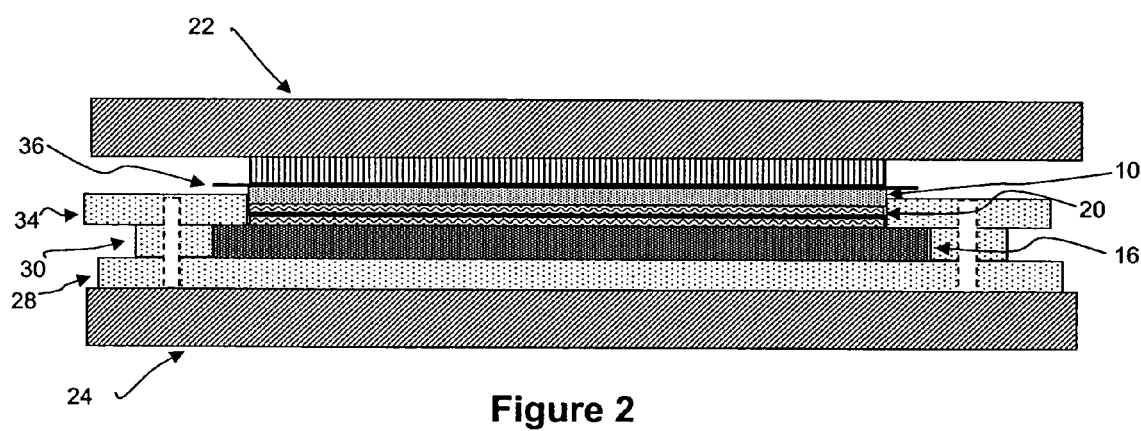
FIG. 2 is a schematic of the press platens being brought together and pressuring the sputter target assembly therebetween.

In another exemplary embodiment of the invention, and with continued reference to FIG. 1, the components to be bonded are placed in a press 26 such as hydraulic, screw, manual or computer operated, so long as it can generate a load of at least about 50,000 lbs. Alignment fixture 28 contains precision spacers 30 which are placed on alignment pins 32, so as to center and align backing plate 16 and sputter target 10. The solder layers (14, 18) are wetted onto the backing plate and the sputter target, respectively, to a thickness ranging from about 0.005 to 0.010 inches. An aluminum spacer plate 34 such as aluminum alloy 6061 is placed on neoprene sheet material 36 to distribute the load uniformly over the backing plate. A load of at least about 50,000 lbs. is applied in bringing the components together as shown in FIG. 2.

Figure 3:
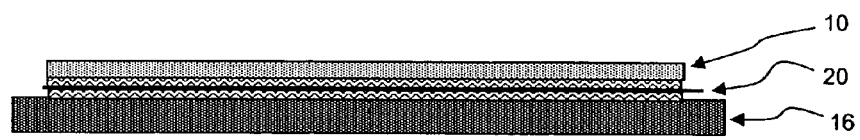
FIG. 3 is a schematic of the final sputter target assembly manufactured by the process of the present invention.

Direct current electrical connections can be attached to the press. In particular, the negative lead from a DC source (not shown) can be attached to the backing plate 16 and the positive lead is connected to the bonding foil 20. As shown in FIG. 2, upon stabilization of the pressure applied via platens 22 and 24, bonding foil 20 is ignited, causing an exothermic reaction as discussed above. The bonding foil melts solder layers 14 and 18 to a depth of about 0.005 inches thus forming a sputter target assembly by attaching a sputter target to a backing plate. Subsequent to bonding, the integrated target assembly is removed from the press, and shown in FIG. 3.

The bonded and machined sputter target assembly can be ultrasonically inspected to determine if there are any defects in the bond. Ultrasonic and mechanical measurements can be made to confirm the dimensions of the finished target assembly configuration.

The sputter target assembly of the present invention will be further described in detail with reference to the following examples, which are, however, not to be construed as limiting the invention.

EXAMPLES

Nine nickel blanks having a purity of 99.995 weight percent were water jet cut from a hot rolled nickel plate having a thickness of 0.375 inches to obtain blank diameters of 17.75 inches. Nine naval brass or copper chromium blanks having a diameter of 21.0 inches and a thickness of 0.750 inches were used as backing plates. All blanks were machined on both sides to obtain parallel surfaces.

Six of the nickel blanks were then bonded to copper chromium backing plates without bonding foil using eutectic solder comprising tin in an amount of 63 weight percent and lead in an amount of 37 weight percent. Three of the nickel blanks and three of the naval brass blanks were pre-wetted using the same solder. Excessive solder was removed by machining to obtain a solder thickness of 0.005 inches to 0.010 inches on both the nickel and the naval brass blanks.

Bonding foil having a thickness of 0.003 inches was placed between the nickel and naval brass blanks using the alignment fixture described above for the latter three nickel target blanks and naval brass blanks. A 0.750 inch thick aluminum 6061 spacer plate having a diameter of 17.75 inches was placed on a neoprene sheet having the same diameter. The negative lead from a DC source was attached to the backing plate and the positive lead was connected to the bonding foil. A load of about 107,000 lbs. was applied in bringing the components together. Upon stabilization of the pressure, the bonding foil was ignited, causing an exothermic reaction as discussed above and melting the solder layers, thus attaching the nickel blanks to the brass backing plates.

The bonded sputter target assemblies were then ultrasonically inspected and a bond coverage of greater than 99 percent was obtained. After machining, ultrasonic thickness measurements were performed to determine nickel and solder thicknesses in 33 locations; the results are summarized in the Table below.

TABLE

| Process | Standard Deviation | Range (in.) | Solder Thickness (in.) |
|---|---|---|---|
| Comparative Example 1 | 0.006 | 0.017 | 0.018 |
| Comparative Example 2 | 0.003 | 0.016 | 0.016 |
| Comparative Example 3 | 0.003 | 0.014 | 0.023 |
| Comparative Example 4 | 0.003 | 0.012 | 0.022 |
| Comparative Example 5 | 0.009 | 0.014 | 0.021 |
| Comparative Example 6 | 0.004 | 0.013 | 0.016 |
| Example 1 (Present Invention) | 0.002 | 0.006 | 0.015 |
| Example 2 (Present Invention) | 0.002 | 0.007 | 0.013 |
| Example 3 (Present Invention) | 0.001 | 0.005 | 0.014 |

Figure 4A:
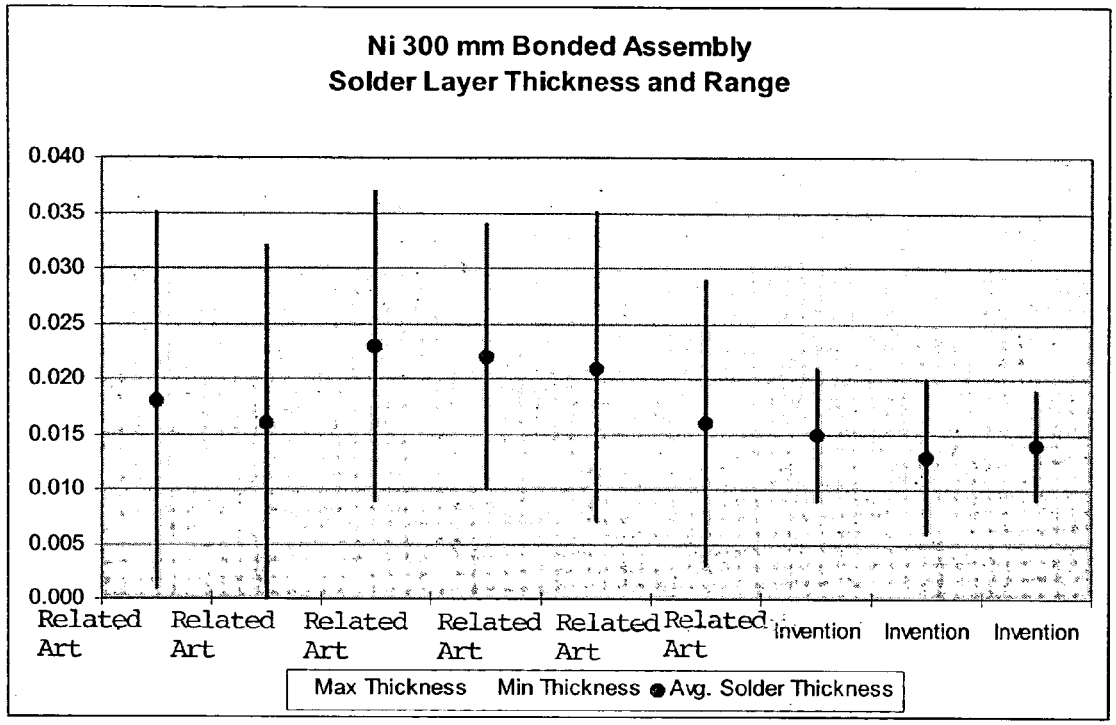
Figure 4B:
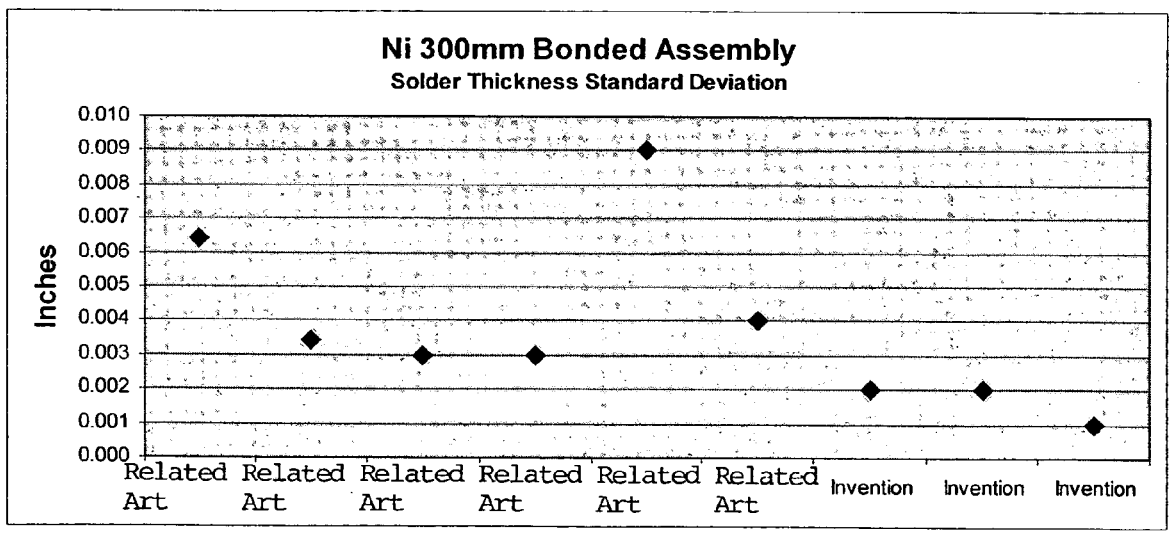
FIG. 4B is a graphical representation of the standard deviation in said solder layer thickness.

For each sputter target assembly in the Table, the solder layer thickness was determined by taking 33 thickness measurements across the target and calculating the nominal (i.e., average) thickness. As illustrated in FIGS. 4A-B and in the Table, the solder layer thickness can vary up to 100% of the nominal thickness. The average solder layer thickness for the conventional targets is 0.019 inches with an average range of 0.014 inches. On the other hand, in the present invention the average thickness is 0.014 inches with an average range of 0.006 inches. This indicates an improvement in the control of the solder layer thickness of up to 57%.

The magnetic leakage flux (MLF), also known as magnetic pass through flux (PTF), of sputter target assemblies utilizing a ferromagnetic target are susceptible to thickness variations. These variations may result from either the solder thickness or the sputter target itself. It has been found that the target assemblies manufactured by the process described herein result in a substantially symmetric MLF. Therefore, the target assemblies are capable of depositing a film with uniform properties onto the substrate.

Figure 5A:
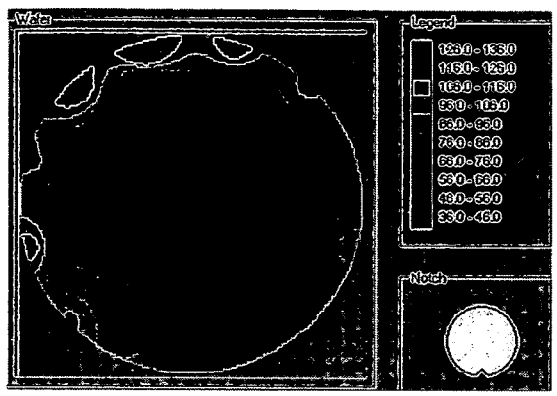
Figure 5B:
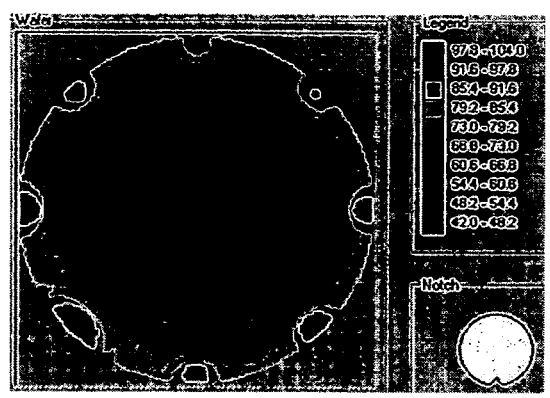
FIG. 5B depicts the symmetric magnetic leakage flux of a target assembly according to the present invention.

To predict the target assembly performance, non-destructive MLF measurements were conducted. The measurements were made using a test fixture table which had a permanently held horseshoe magnet in proximity to the planar surface of the sputter target assembly tested. A Hall probe was introduced to measure the magnetic field penetrating the target and entering from behind the target. As shown in FIGS. 5A-B, the MLF maps exhibit a series of concentric rings of various colors. Specifically, as shown in FIG. 5A, a conventional sputter target assembly has a non-symmetric MLF with a range of 100 Gauss (from 36 to 136 Gauss). FIG. 5B depicts a symmetric MLF map that shows a concentric pattern and a range of only 62 Gauss (from 42 to 104 Gauss). A target assembly having the kind of MLF map shown in FIG. 5B is capable of depositing a film with uniform properties onto the substrate. The varying degrees of color close to the edge of the target indicate the higher MLF related to the edge effect produced by the magnetic field.

Although the invention has been described in detail with reference to certain preferred embodiments, those skilled in the art will recognize that there are other embodiments of the invention within the spirit and the scope of the claims.

We claim:

1. A method of forming a sputter target assembly, comprising the steps of:
   providing a backing plate having a top surface, and pre-wetting the top surface with a solder layer;
   providing a ferromagnetic sputter target, without a taper, with a substantially even magnetic permeability throughout the material having a bottom surface, and pre-wetting the bottom surface with a solder layer;
   introducing a bonding foil, between the backing plate and the ferromagnetic sputter target, wherein the bonding foil is an ignitable heterogeneous stratified structure for the propagation of an exothermic reaction;
   pressing the backing plate and the ferromagnetic sputter target together and igniting the bonding foil, therebetween to melt and bond the solder layer on the backing plate with the solder layer on the ferromagnetic sputter target without affecting the microstructure or flatness of the ferromagnetic sputter target in the formation of the sputter target assembly with a substantially symmetric magnetic leakage flux.

2. The method of forming a sputter target assembly of claim 1, further comprising,
   aligning the target and backing plate in a press, prior to pressing and thereafter applying a load of at least 50,000 lbs.

3. The method of forming a sputter target assembly of claim 1, wherein the backing plate and the sputter target are made of different materials.

4. The method of forming a sputter target assembly of claim 1, wherein the solder layers are eutectic solder comprising tin in an amount of 63 weight percent and the balance is lead.

5. The method of forming a sputter target assembly of claim 1, wherein the solder layers are of substantially the same thickness.

6. The method of forming a sputter target assembly of claim 1, further comprising connecting the negative lead from a DC source to the backing plate and the positive lead from a DC source to the bonding foil to ignite the foil and initiate the exothermic reaction.

7. The method of forming a sputter target assembly of claim 1, wherein the thickness of the bonding foil ranges from about 0.002 to about 0.003 inches.

8. The method of forming a sputter target assembly of claim 1, wherein the solder layers have a thickness ranging from about 0.005 to 0.010 inches.

9. The method of forming a sputter target assembly of claim 1, wherein the pressure is applied via a hydraulic press, screw or manual press.

10. The method of forming a sputter target assembly of claim 1, wherein the bonding foil is selected from among silicides, aluminides, borides, carbides, thermite reacting compounds, alloys, metallic glasses and composites.

11. The method of forming a sputter target assembly of claim 1, the solder material is selected from among indium-tin, tin-lead, or tin-silver-copper.

12. The method of forming a sputter target assembly of claim 1, wherein the sputter target is a high-purity ferromagnetic nickel, nickel alloy, cobalt, or cobalt alloy target.

13. The method of forming a sputter target assembly of claim 1, wherein the magnetic flux across the sputter target is symmetrically distributed.

* * * * *